United States Patent [19]
Hashemi et al.

[11] Patent Number: 5,514,606
[45] Date of Patent: May 7, 1996

[54] METHOD OF FABRICATING HIGH BREAKDOWN VOLTAGE FETS

[75] Inventors: Majid M. Hashemi, Tempe; Saied N. Tehrani, Scottsdale, both of Ariz.

[73] Assignee: Motorola, Schaumburg, Ill.

[21] Appl. No.: 270,275

[22] Filed: Jul. 5, 1994

[51] Int. Cl.$^6$ ............................................. H01L 21/338
[52] U.S. Cl. ............... 437/41; 437/912; 437/176; 437/184
[58] Field of Search .................. 437/41, 912, 176, 437/184, 133, 41 SH

[56] References Cited

U.S. PATENT DOCUMENTS

| | | | |
|---|---|---|---|
| 4,540,446 | 9/1985 | Nonaka et al. | 437/176 |
| 5,001,076 | 3/1991 | Mikkelson | 437/176 |
| 5,041,393 | 8/1991 | Ahrens et al. | 437/912 |
| 5,196,359 | 3/1993 | Shih et al. | 437/912 |

FOREIGN PATENT DOCUMENTS

| | | | |
|---|---|---|---|
| 53-45170 | 4/1978 | Japan | 437/176 |
| 60-49674 | 3/1985 | Japan | 437/176 |
| 60-148170 | 8/1985 | Japan | 437/176 |
| 63-248136 | 10/1988 | Japan | 437/912 |
| 1-82650 | 3/1989 | Japan | 437/176 |
| 1-161720 | 6/1989 | Japan | 437/184 |
| 2-49439 | 2/1990 | Japan | 437/912 |
| 3-190241 | 8/1991 | Japan | 437/912 |
| 3-185843 | 8/1991 | Japan | 437/912 |
| 4-102326 | 4/1992 | Japan | 437/912 |
| 5-21174 | 8/1993 | Japan | 437/912 |
| 6-177157 | 6/1994 | Japan | 437/176 |

OTHER PUBLICATIONS

Chang-Lee Chen et al., "High-Breakdown-Voltage MESFET with a Low-Temperature-Grown GaAs Passivation Layer and Overlapping Gate Structure", IEEE Electron Device Letters, vol. 13, No. 6, Jun. 1992, pp. 335–337.

F. W. Smith et al., "A 1.57 W/mm GaAs-Based MISFET for High-Power and Microwave-Switching Applications", 1991 IEEE MTT-S Digest, pp. 643–646.

Primary Examiner—Mary Wilczewski
Attorney, Agent, or Firm—Eugene A. Parsons

[57] ABSTRACT

A method of fabricating high breakdown voltage MESFETs forming a conduction channel in a GaAs substrate adjacent the surface, forming high temperature stable source and drain ohmic contacts and a Schottky gate contact on the surface of the substrate in overlying relationship to the channel and in spaced relationship, and depositing a layer of low temperature GaAs passivation material over the substrate surface and the source, drain and gate contacts. Openings are then etched in the passivation material for contacting the source, drain and gate contacts.

9 Claims, 2 Drawing Sheets

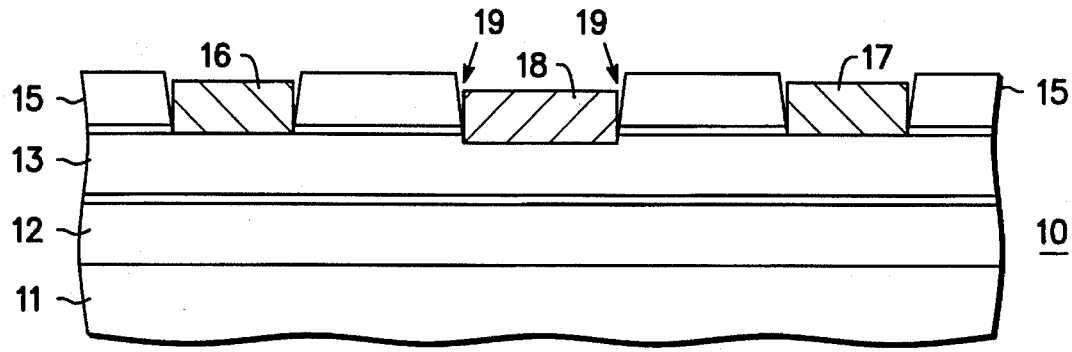
- PRIOR ART -   *FIG. 1*
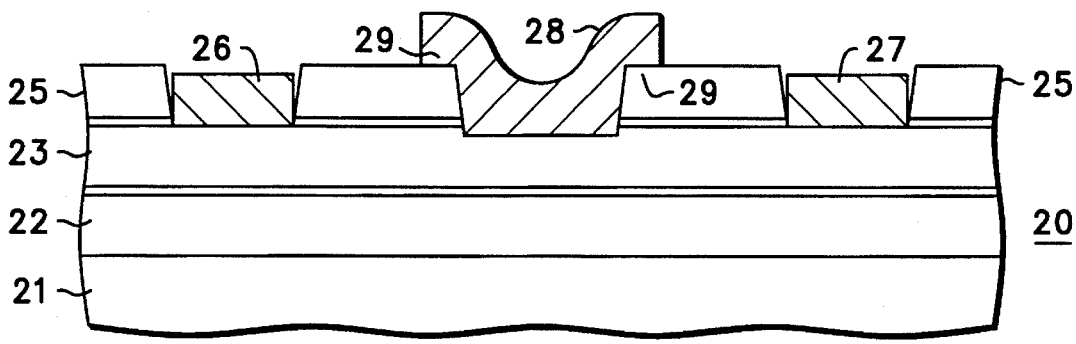
- PRIOR ART -   *FIG. 2*
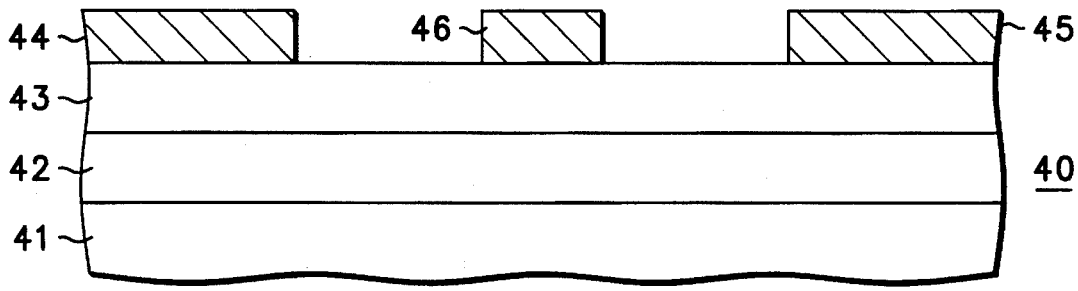
*FIG. 3*
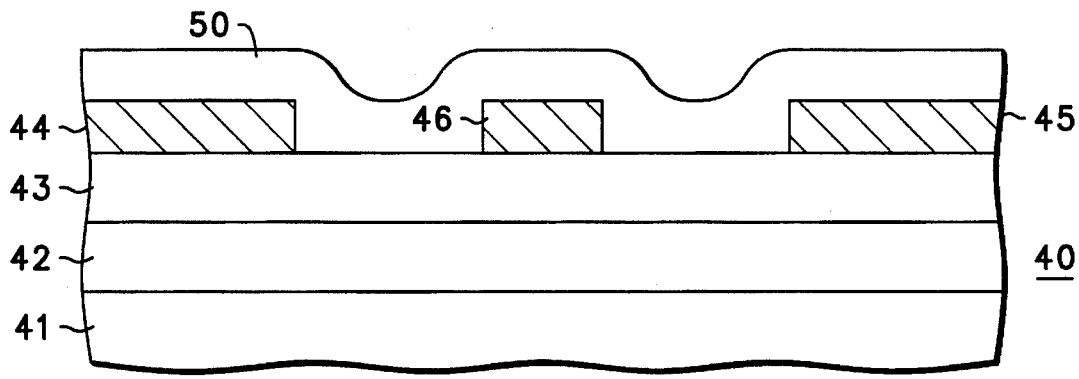
*FIG. 4*

METHOD OF FABRICATING HIGH BREAKDOWN VOLTAGE FETS

FIELD OF THE INVENTION

The present invention pertains to field effect transistors (FETs) and more specifically to high breakdown voltage FETs.

BACKGROUND OF THE INVENTION

The gate-drain breakdown voltage of a GaAs MESFET is one of the most important factors limiting the maximum output power of the MESFET. Many prior methods to increase the breakdown voltage, such as a double gate recess and increased gate-drain spacing, are often accompanied by lower RF gain and/or drain saturation current. Attempts to increase the gate-drain breakdown voltage by placing an insulator between the gate metal and the MESFET channel usually introduce undesirable interface states.

Recently, GaAs MISFETs with a low interface-state density were realized using a high-resistivity low-temperature-grown GaAs layer as the gate insulator. In a conventional gate MESFET, the high-resistivity low-temperature-grown GaAs layer is deposited and then etched to allow the deposition of source, drain and gate metal contacts. The major problem with this method is that a gap remains between the sides of the metal contacts and the high-resistivity low-temperature-grown GaAs layer which substantially reduces the breakdown voltage of the MESFET.

In an attempt to solve this problem, the gate metal was deposited so as to overlap the high-resistivity low-temperature-grown GaAs layer. However, the overlap gate process is difficult and complicated and requires a critical alignment and wet etching process and is not, therefore, easily manufacturable, especially for sub-micron gate dimensions.

It would be desirable, therefore, to devise a method of fabricating high breakdown voltage MESFETs which is relatively easily manufacturable.

It is a purpose of the present invention to provide a method of fabricating high breakdown voltage MESFETs which is relatively easily manufacturable.

It is a further purpose of the present invention to provide a method of fabricating high breakdown voltage MESFETs which eliminates any critical processing steps.

It is a still further purpose of the present invention to provide a method of fabricating high breakdown voltage MESFETs which includes the formation of stable source, drain and gate contacts.

SUMMARY OF THE INVENTION

The above problems and others are substantially solved and the above purposes and others are realized in a method of fabricating high breakdown voltage FETs including forming a conduction channel in a substrate adjacent to the surface, forming high temperature stable source and drain ohmic contacts and a Schottky gate contact on the surface of the substrate in overlying relationship to the channel and in spaced relationship, and depositing a layer of passivation material over the substrate surface and the source, drain and gate contacts. Openings are then etched in the passivation material for contacting the source, drain and gate contacts.

BRIEF DESCRIPTION OF THE DRAWINGS

Referring to the drawings:

FIG. 1 is a simplified cross-sectional view of a prior art conventional gate MESFET;

FIG. 2 is a simplified cross-sectional view of a prior art overlapping gate MESFET;

FIG. 3 is a simplified cross-sectional view of an intermediate step in the fabrication of high breakdown voltage FET in accordance with the present invention;

FIG. 4 is a simplified cross-sectional view of another intermediate step in the fabrication of a high breakdown voltage FET in accordance with the present invention.

DESCRIPTION OF THE PREFERRED EMBODIMENT

Figure 5:
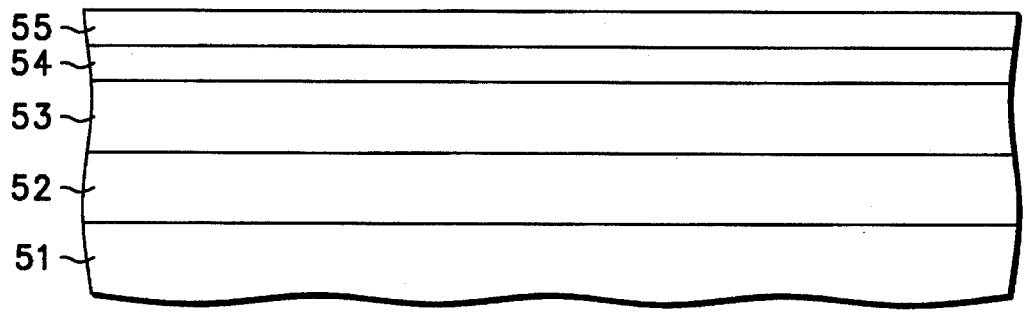
FIGS. 5, 6 and 7 are simplified cross-sectional views of intermediate steps in the fabrication of another embodiment of a high breakdown voltage FET in accordance with the present invention.

Referring specifically to FIG. 1, a prior art MESFET 10 and method of fabrication are illustrated. MESFET 10 is formed on a substrate 11 having a layer 12 of low-temperature-grown gallium arsenide (LTG GaAs) formed as a buffer layer. A channel layer 13 of relatively heavily doped ($4\times10^{17} cm^{-3}$) GaAs is formed over layer 12 with a very thin layer (100 angstroms) of aluminum arsenide (AlAs) therebetween. A layer 15 of LTG GaAs is formed on channel layer 13 as an insulating layer with a very thin layer (100 angstroms) of AlAs therebetween.

Insulating layer 15 (including the very thin AlAs layer) is then etched, utilizing usual and well known masking techniques, to open areas for source, drain and gate contacts wherein the surface of layer 13 is exposed. Source and drain contacts 16 and 17, respectively, are deposited on the surface and a gate contact 18 is deposited on the surface of layer 13. A major problem with this process is that openings 19 remain between gate contact 18 and the edges of insulating layer 15. Openings 19 greatly reduce the potential at which breakdown occurs and, thus, greatly reduce the breakdown voltage of MESFET 10. Also, a critical alignment and etching process is required and, therefore, MESFET 10 is not easily manufacturable, especially for sub-micron gate dimensions.

Referring specifically to FIG. 2, a prior art MESFET 20 and method of fabrication are illustrated. MESFET 20 is formed on a substrate 21 having a layer 22 of low-temperature-grown gallium arsenide (LTG GaAs) formed as a buffer layer. A channel layer 23 of relatively heavily doped ($4\times10^{17} cm^3$) GaAs is formed over layer 22 with a very thin layer (100 angstroms) of aluminum arsenide (AlAs) therebetween. A layer 25 of LTG GaAs is formed on channel layer 23 as an insulating layer with a very thin layer (100 angstroms) of AlAs therebetween.

Insulating layer 25 (including the very thin AlAs layer) is then etched, utilizing usual and well known masking techniques, to open areas for source, drain and gate contacts wherein the surface of layer 23 is exposed. Source and drain contacts 26 and 27, respectively, are deposited on the surface. A gate contact 28 is deposited on the surface of layer 23 so as to overlap the edges of insulating layer 25 at 29. A major problem with this process is that to form overlapping portions 29 a critical alignment and wet etching process is required. Also, high temperature processes that are required for the fabrication of the device degrade the quality of layer 25 and also result in diffusion of impurities from layer 25 to channel layer 23. Therefore, MESFET 20 is not easily manufacturable, especially for sub-micron gate dimensions.

Referring specifically to FIG. 3, a simplified cross-sectional view of an intermediate step in the fabrication of a high breakdown voltage FET 40, in accordance with the present invention, is illustrated. In this specific example, FET 40 is a MESFET and includes a GaAs substrate 41 having a buffer layer 42 formed thereon. For purposes of this disclosure, buffer layer 42 is considered to be a portion of the substrate and, therefore, layers 41 and 42 will be referred to hereafter as substrate 41. A conduction channel 43 is formed adjacent the surface of substrate 41 and appropriately doped, generally as follows.

A gate contact 46 is formed in overlying relationship to conduction channel 43 and approximately midway between positions at which it is desired to form source and drain regions. Contact 46 forms a Schottky contact with substrate 41 and, in this embodiment, includes TiWN metal. Generally, gate contact 46 is formed first and then used as a mask to implant low resistivity source and drain regions in spaced apart relationship in channel layer 43, followed by a high temperature anneal, generally in the range of 750° C. to 900° C. and more specifically approximately 800° C., to activate the implant.

Subsequent to the anneal, a source contact 44 and a drain contact 45 are formed on the surface of substrate 41 in overlying relationship to the source and drain regions in conduction channel 43. Contacts 44 and 45 form ohmic contacts with substrate 41 and, in this embodiment, include Ni/Ge/W metal. Because the contacts are formed using refractory metal tungsten (W) high temperature stable ohmic contacts can be formed. A temperature in the range of 500° to 600° Centigrade is utilized to form the ohmic contacts and, in this specific example, 550°.

Referring specifically to FIG. 4, the wafer is completely passivated by forming a passivation layer 50 of good dielectric material. In the present specific embodiment, for example, a layer of low-temperature GaAs is grown, by some convenient process such as molecular beam epitaxy, metal organic chemical vapor deposition, or the like, over the entire structure. By forming contacts 44, 45 and 46 before passivation layer 50 is formed, the higher temperature required to form stable contacts does not effect passivation layer 50, which greatly simplifies the manufacturing process. Also, because the contact layers 44, 45 and 46 are stable at high temperatures, the growth of passivation layer 50 will not degrade the device performance. Further, by forming contacts 44, 45 and 46 and then forming passivation layer 50, no openings are left between the contacts and the passivation layer and the breakdown voltage remains relatively high.

Once passivation layer 50 is properly formed, layer 50 can be etched to expose portions of contacts 44, 45, and/or 46 as required. In some specific applications connections between various contacts on a single wafer may be formed during the formation of contacts 44, 45, and/or 46. Generally, passivation layer 50 will be etched after the formation thereof and electrical connections will be formed to the exposed portions in a manner well known in the art.

In still another embodiment of the present invention, referring specifically to FIG. 5, a plurality of heterojunction layers are grown on a substrate 51. The heterojunction layers include a buffer layer 52, a conduction channel layer 53, a supply layer 54 and a contact layer 55. Buffer layer 52 is included to crystal match the device to substrate 51. Conduction channel layer 53 is formed of any convenient material that matches the material system being utilized, as for example, in this specific embodiment GaAs or InGaAs. Supply layer 54 is doped to provide carriers to conduction channel layer 53 and is again formed of any convenient material in the material system being utilized as, for example, in this specific embodiment AlGaAs. Contact layer 55 is then formed on supply layer 54 and is heavily doped to form a low contact resistance with ohmic metal contacts to be formed later.

Figure 6:
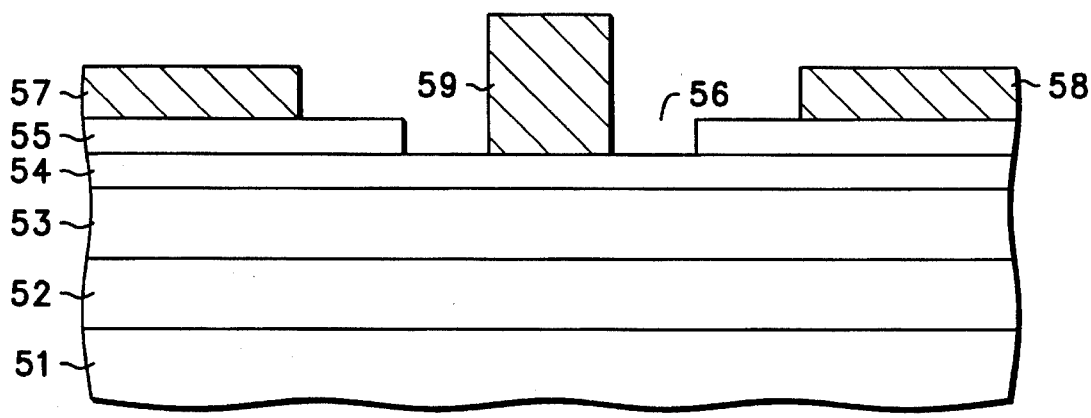

Referring specifically to FIG. 6, an etched groove 56 is formed in contact layer 55 by selectively removing a portion of contact layer 55. A source contact 57 and a drain contact 58 are formed on the surface of contact layer 55 in spaced relationship on opposite sides of groove 56. Source and drain contacts 57 and 58 form ohmic contacts with contact layer 55 in a manner generally as described above, and include, for example, temperature stable Ni/Ge/W metal.

Figure 7:
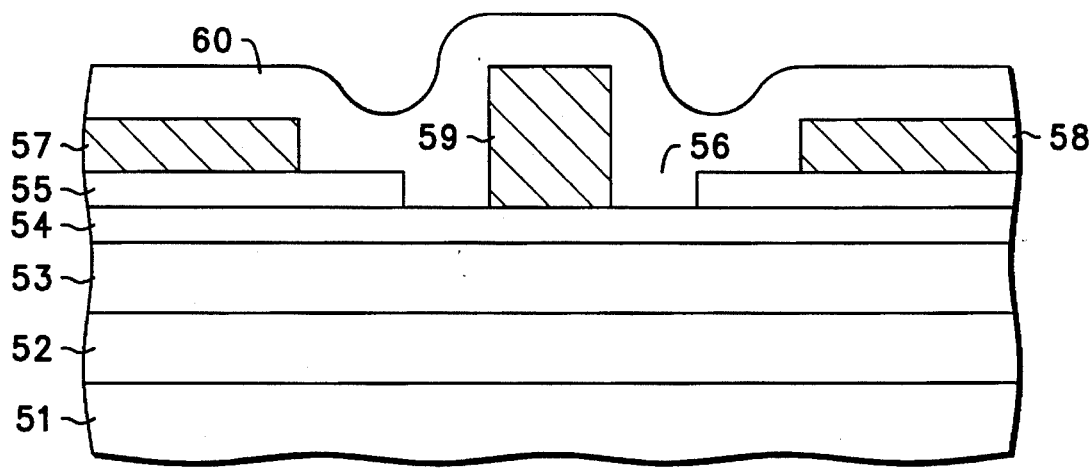

Referring now to FIG. 7, the wafer is completely passivated by forming a passivation layer 60 of good dielectric material over the entire structure. In this specific embodiment, layer 60 is formed of low temperature GaAs grown over the entire structure by molecular beam epitaxy, metal organic chemical vapor deposition, etc. Layer 60 forms a single crystal on layers 55 and 54 and forms a polycrystalline layer on contacts 57, 58 and 59.

A method of fabricating high breakdown voltage MESFETs and heterojunction FETs is disclosed which eliminates any critical processing steps. Further, the novel method of fabricating high breakdown voltage MESFETs and heterojunction FETs includes the formation of stable source, drain and gate contacts while eliminating critical processing steps required in the prior art. Also, openings between the contacts and the passivation layer are eliminated so that the breakdown voltage is increased relative to many prior art structures. Thus, the present invention provides a method of fabricating high breakdown voltage FETs which are relatively easy to manufacture and which generally have a higher breakdown voltage than prior art structures.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating high breakdown voltage FETs comprising the steps of:

providing a substrate of semi-insulating GaAs having a surface;

forming a gate contact on the surface of the substrate between predetermined source and drain regions including depositing a refractory metal to form a Schottky contact with the surface of the substrate;

doping the substrate to form a conduction channel in the substrate adjacent the surface and at least in the source and drain regions;

forming source and drain contacts on the surface of the substrate in overlying relationship to the conduction channel and in the predetermined source and drain regions, respectively, including depositing a refractory metal to form ohmi contacts with the surface of the substrate;

depositing a layer of low temperature GaAs passivation material over the substrate surface and the source, drain and gate contacts; and removing some of the passivation material to expose portions of the source, drain and gate contacts to allow external connections thereto.

2. A method of fabricating high breakdown voltage FETs as claimed in claim 1 wherein the step of depositing a metal to form a Schottky contact includes depositing TiWN.

3. A method of fabricating high breakdown voltage FETs as claimed in claim 2 wherein the step of doping the substrate to form a conduction channel includes implanting a dopant to define source and drain regions and annealing the implant at a temperature in the range of 750° to 900°Centigrade to activate the implant.

4. A method of fabricating high breakdown voltage FETs as claimed in claim 3 wherein the step of depositing a metal to form ohmic contacts includes depositing Ni/Ge/W.

5. A method of fabricating high breakdown voltage FETs comprising the steps of:

provisiong a substrate having a surface;

forming a conduction channel in the substrate adjacent the surface;

forming a gate contact on the surface of the substrate in overlying relationship to the channel and between the source and drain contacts;

implanting a dopant in the conduction channel to define source and drain regions in the conduction channel on opposite sides of the gate contact;

annealing the source and drain regions at a temperature in the range of 750° to 900° Centigrade to activate the implant;

forming source and drain contacts on the surface of the source and drain regions in overlying relationship to the channel subsequent to the annealing of the source and drain regions; and forming a layer of low-temperature-grown GaAs passivation material over the substrate surface and the source, drain and gate contacts.

6. A method of fabricating high breakdown voltage FETs comprising the steps of:

providing a substrate of semi-insulating GaAs including a plurality of epitaxially grown layers with at least a conduction channel layer and a contact layer positioned thereon so as to form an exposed surface of the contact layer;

forming a groove through the contact layer so as to expose a portion of a surface of the conduction channel layer;

forming source and drain contacts on the exposed surface of the contact layer and on opposite sides of the groove;

forming a gate contact in the groove on the exposed surface of the conduction channel layer and between the source and drain contacts; and depositing a layer of low temperature GaAs passivation material over the substrate surface, the groove and the source, drain and gate contacts.

7. A method of fabricating high breakdown voltage FETs as claimed in claim 6 including in addition the step of etching some of the passivation material to expose portions of the source, drain and gate contacts to allow external connections thereto.

8. A method of fabricating high breakdown voltage FETs as claimed in claim 6 wherein the step of forming source and drain contacts includes depositing Ni/Ge/W, to form ohmic contacts with the surface of the contact layer.

9. A method of fabricating high breakdown voltage FETs as claimed in claim 6 wherein the step of forming a gate contact includes depositing TiWN, to form a Schottky contact with the surface of the conduction channel layer.

* * * * *